US012421599B2

(12) United States Patent
Yeon et al.

(10) Patent No.: US 12,421,599 B2
(45) Date of Patent: *Sep. 23, 2025

(54) GROWTH INHIBITOR FOR FORMING THIN FILM, METHOD OF FORMING THIN FILM USING GROWTH INHIBITOR, AND SEMICONDUCTOR SUBSTRATE FABRICATED BY METHOD

(71) Applicant: SOULBRAIN CO., LTD., Gyeonggi-do (KR)

(72) Inventors: Chang Bong Yeon, Gyeonggi-do (KR); Jin Hee Kim, Gyeonggi-do (KR); Jae Sun Jung, Gyeonggi-do (KR); Jong Moon Kim, Gyeonggi-do (KR); Seung Hyun Lee, Gyeonggi-do (KR); Seok Jong Lee, Gyeonggi-do (KR)

(73) Assignee: SOULBRAIN CO., LTD., Gyeonggi-do (KR)

( * ) Notice: Subject to any disclaimer, the term of this patent is extended or adjusted under 35 U.S.C. 154(b) by 67 days.

This patent is subject to a terminal disclaimer.

(21) Appl. No.: 18/014,265

(22) PCT Filed: Jul. 16, 2021

(86) PCT No.: PCT/KR2021/009166
§ 371 (c)(1),
(2) Date: Jan. 3, 2023

(87) PCT Pub. No.: WO2022/015098
PCT Pub. Date: Jan. 20, 2022

(65) Prior Publication Data
US 2023/0313372 A1    Oct. 5, 2023

(30) Foreign Application Priority Data
Jul. 16, 2020    (KR) .................. 10-2020-0088446

(51) Int. Cl.
*C23C 16/455*    (2006.01)
*C23C 16/02*    (2006.01)
(Continued)

(52) U.S. Cl.
CPC .... *C23C 16/45534* (2013.01); *C23C 16/0272* (2013.01); *C23C 16/4408* (2013.01); *H01L 21/0228* (2013.01); *H01L 21/02304* (2013.01)

(58) Field of Classification Search
None
See application file for complete search history.

(56) References Cited

U.S. PATENT DOCUMENTS 1,993,719 A * 3/1935 Nutting ................. C07C 17/358
570/220
4,816,452 A * 3/1989 Pearson ............. C07D 277/587
514/196
(Continued)

FOREIGN PATENT DOCUMENTS

CN    101336225 A    12/2008
CN    101809187 A    8/2010
(Continued)

OTHER PUBLICATIONS

Chemical Book.2-Bromo-2-methylpropane. <<https://www.chemicalbook.com/ChemicalProductProperty_EN_CB8463157.htm>>, 2023, last viewed Aug. 2, 2024. (Year: 2023).*
(Continued)

*Primary Examiner* — Alexander M Weddle
(74) *Attorney, Agent, or Firm* — SZDC Law PC

(57) ABSTRACT

The present invention relates to a growth inhibitor for forming a thin film, a method of forming a thin film using the growth inhibitor, and a semiconductor substrate fabricated by the method. More specifically, the growth inhibitor for forming a thin film of the present invention is a com-
(Continued)

pound represented by Chemical Formula 1: $A_nB_mX_oY_iZ_j$. In Chemical Formula 1, A is carbon or silicon; B is hydrogen or an alkyl group having 1 to 3 carbon atoms; X includes one or more of fluorine (F), chlorine (Cl), bromine (Br), and iodine (I); Y and Z independently include one or more selected from the group consisting of oxygen, nitrogen, sulfur, and fluorine and are different from each other; n is an integer from 1 to 15; o is an integer greater than or equal to 1; m is 0 to 2n+1; and i and j are integers from 0 to 3.

6 Claims, 6 Drawing Sheets

(51) Int. Cl.
*C23C 16/44* (2006.01)
*H01L 21/02* (2006.01)

(56) References Cited

U.S. PATENT DOCUMENTS

| | | | |
|---|---|---|---|
| 11,746,411 B2* | 9/2023 | Yeon | H01L 21/76841 427/532 |
| 2013/0149846 A1 | 6/2013 | Koshi et al. | |
| 2018/0005836 A1* | 1/2018 | Lim | H01L 21/76829 |
| 2019/0390340 A1 | 12/2019 | Yu et al. | |
| 2020/0234943 A1* | 7/2020 | Bhuyan | C23C 16/45525 |
| 2021/0104396 A1* | 4/2021 | Jung | H01L 21/28194 |

FOREIGN PATENT DOCUMENTS

| | | |
|---|---|---|
| CN | 101556948 B | 9/2012 |
| CN | 107578995 A | 1/2018 |
| JP | H11158206 A | 6/1999 |
| JP | 2002-097414 A | 4/2002 |
| JP | 2015510263 A | 4/2015 |
| JP | 2018006753 A | 1/2018 |
| KR | 10-2006-0037241 A | 5/2006 |
| KR | 10-2009-0101437 A | 9/2009 |
| KR | 10-2018-0120119 A | 11/2018 |
| KR | 10-2019-0036794 A | 4/2019 |
| KR | 10-2019-0061877 A | 6/2019 |
| KR | 10-2254394 B1 | 5/2021 |

OTHER PUBLICATIONS

"Chemeo: Chemical Properties of Propane, 1,1,1,2-tetrachloro". <https://www.chemeo.com/cid/37-339-5/Propane-1-1-1-2-tetrachloro#ref-yaws_antoine_pvap>>, (Nov. 30, 2023, last viewed Jan. 28, 2025) (Year: 2023).*

"Chemical Book: 1,1,1,2-Tetrachloropropane". <<https://www.chemicalbook.com/ ProductChemicalPropertiesCB2129466_EN.htm>>, (Jun. 21, 2022, Last viewed Jan. 28, 2025) (Year: 2022).*

* cited by examiner

[FIG. 1]
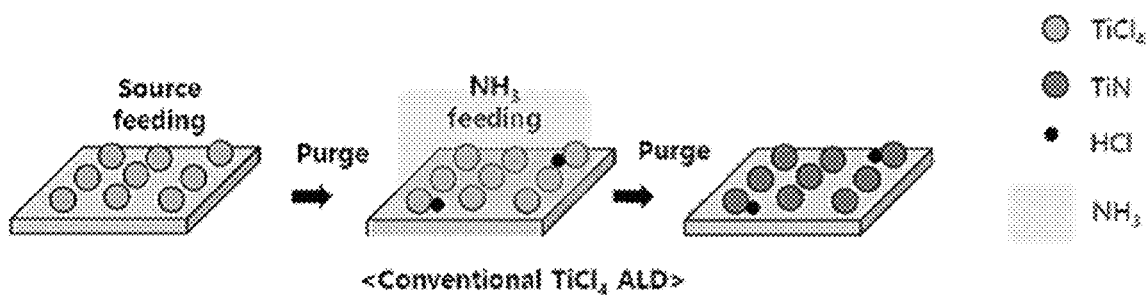
[FIG. 2]
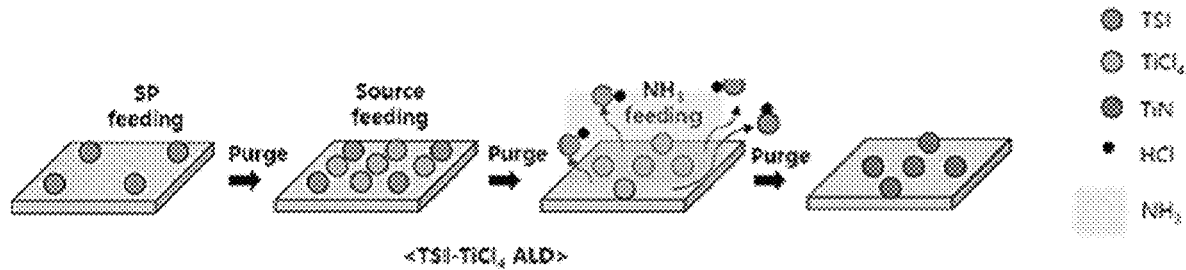

[FIG. 3]
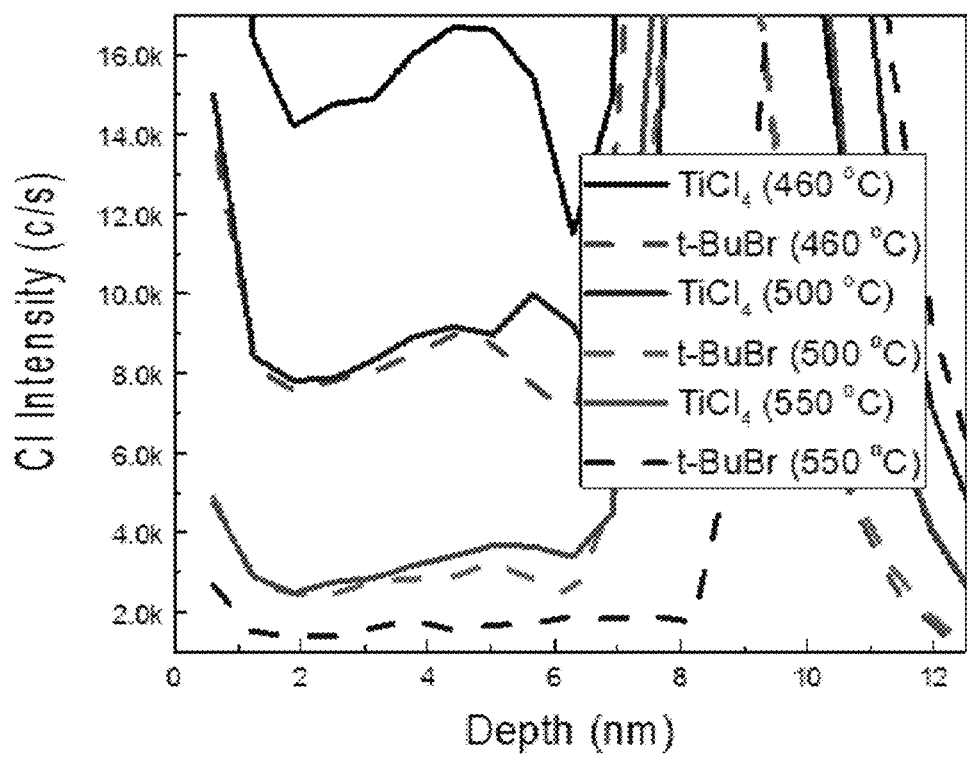

[FIG. 4]
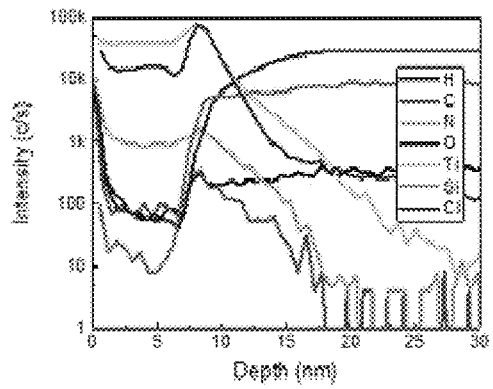
<460 °C TiCl₄ SIMS depth profile>
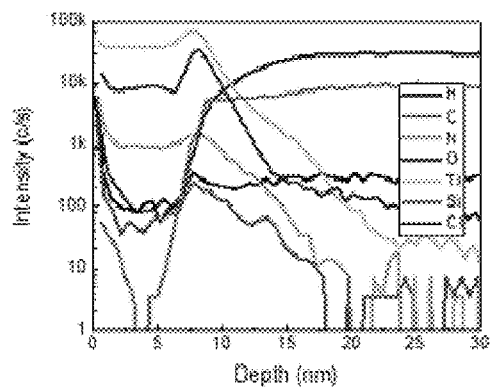
<460 °C E2-TiCl₄ SIMS depth profile>
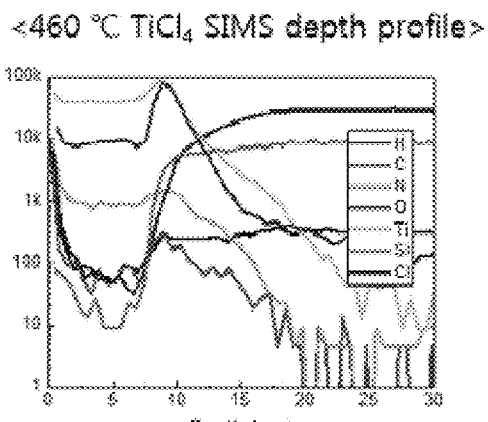
<500 °C TiCl₄ SIMS depth profile>
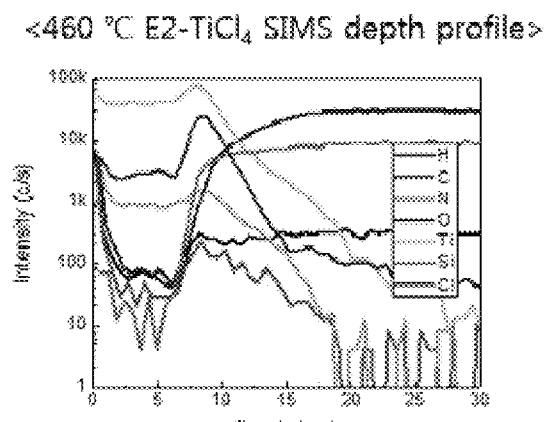
<500 °C E2-TiCl₄ SIMS depth profile>
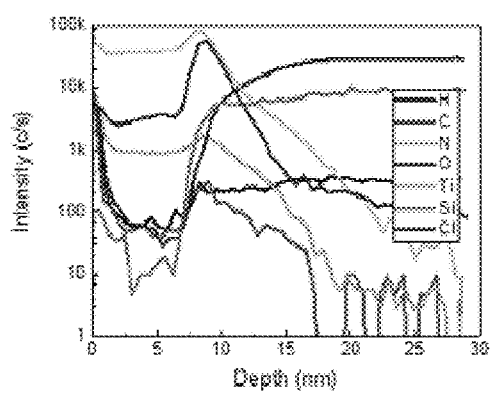
<550 °C TiCl₄ SIMS depth profile>
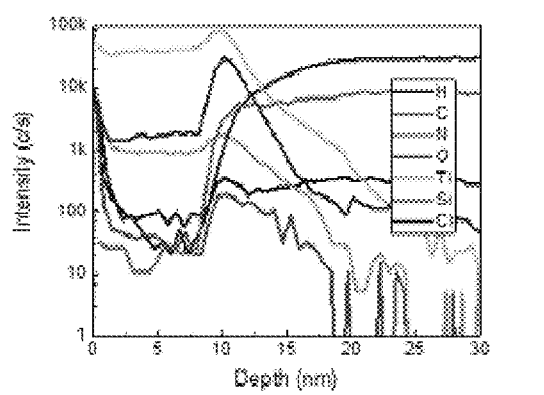
<550 °C E2-TiCl₄ SIMS depth profile>

[FIG. 5]
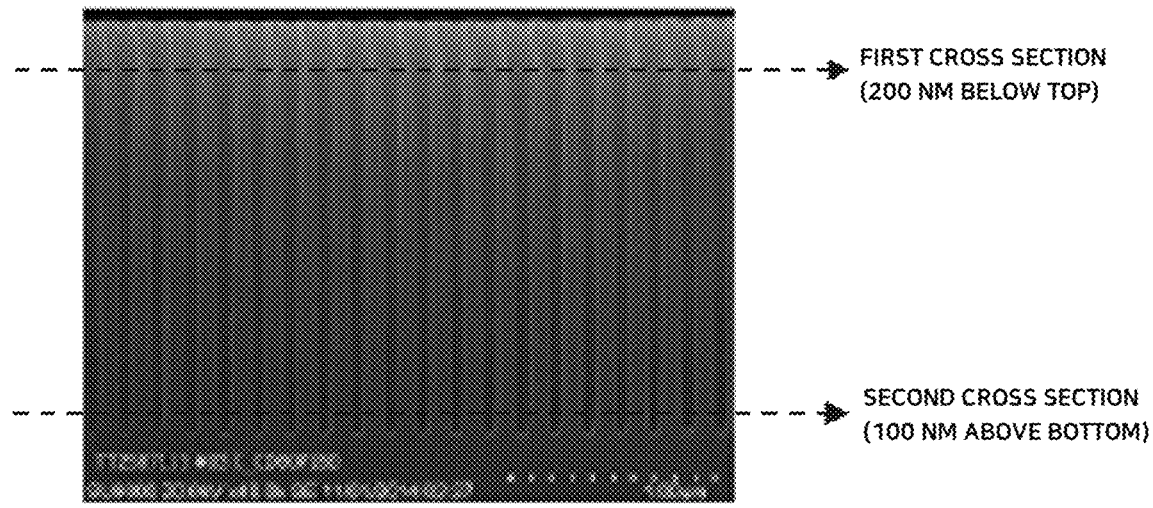
→ FIRST CROSS SECTION (200 NM BELOW TOP)
→ SECOND CROSS SECTION (100 NM ABOVE BOTTOM)
[FIG. 6]
| | COMPARATIVE EXAMPLE 1 | EXAMPLE 1 |
|---|---|---|
| Top | | |
| Bottom | | |

[FIG. 7]
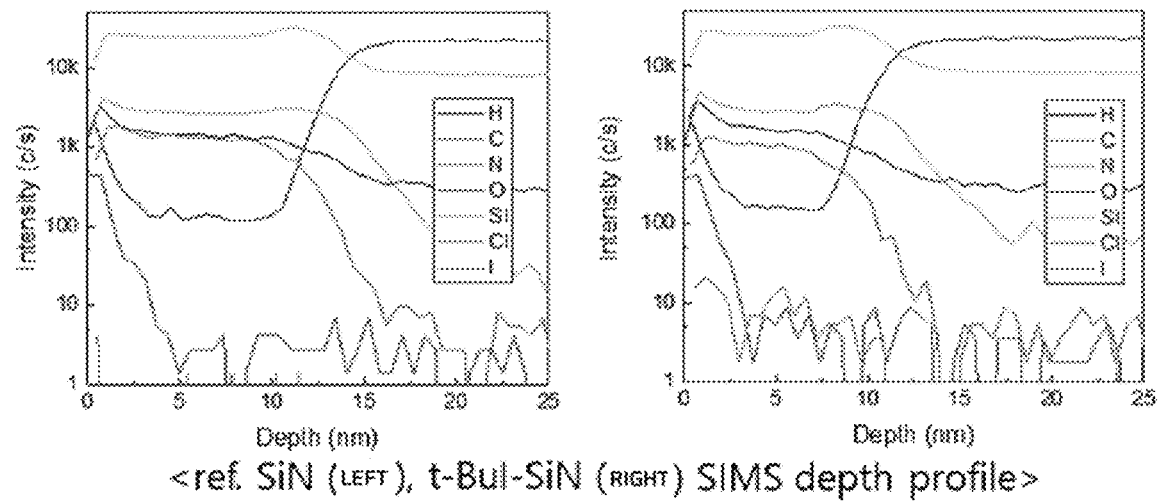
<ref. SiN (LEFT), t-Bul-SiN (RIGHT) SIMS depth profile>
[FIG. 8]
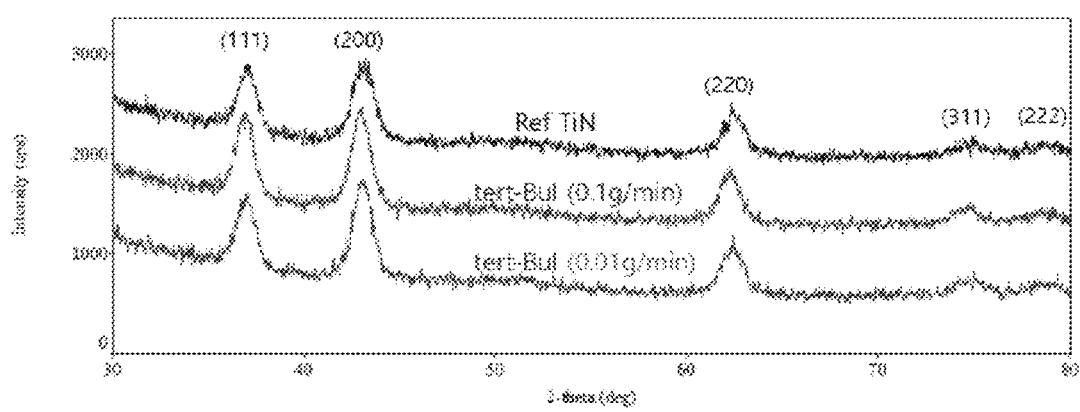

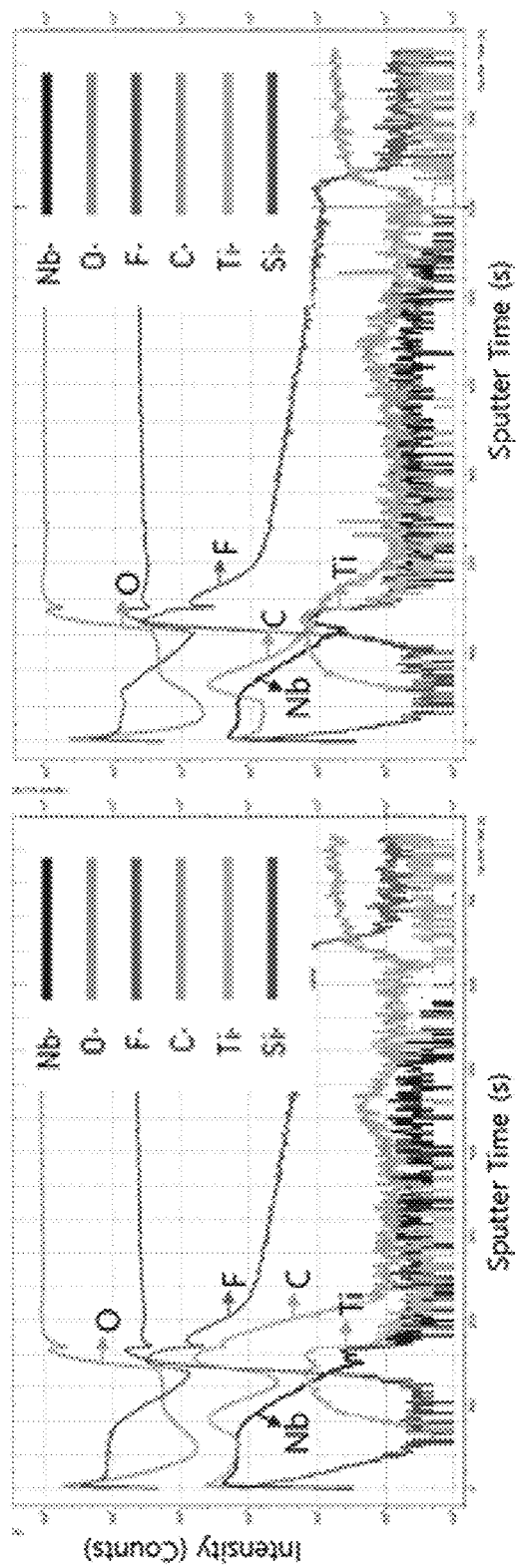
[FIG. 9]

GROWTH INHIBITOR FOR FORMING THIN FILM, METHOD OF FORMING THIN FILM USING GROWTH INHIBITOR, AND SEMICONDUCTOR SUBSTRATE FABRICATED BY METHOD

This application is the National Stage Application of PCT/KR2021/009166, filed on Jul. 16, 2021, which claims priority to Korean Patent Application No. KR 10-2020-0088446, filed on Jul. 16, 2020, which is incorporated by reference for all purposes as if fully set forth herein.

TECHNICAL FIELD

The present invention relates to a growth inhibitor for forming a thin film, a method of forming a thin film using the growth inhibitor, and a semiconductor substrate fabricated by the method. More particularly, the present invention relates to a thin film-forming growth inhibitor capable of inhibiting side reactions to appropriately reduce the growth rate of a thin film and capable of removing process by-products from a thin film to prevent corrosion or deterioration and greatly improve step coverage and the thickness uniformity of the thin film even when the thin film is formed on a substrate having a complicated structure, a method of forming a thin film using the growth inhibitor, and a semiconductor substrate fabricated by the method.

BACKGROUND ART

Development of high-integration memory and non-memory semiconductor devices is actively progressing. As the structures of memory and non-memory semiconductor devices become increasingly complex, the importance of step coverage is gradually increasing in depositing various thin films on substrates.

The thin film for semiconductors is made of a metal nitride, a metal oxide, a metal silicide, or the like. Examples of the metal nitride include titanium nitride (TiN), tantalum nitride (TaN), zirconium nitride (ZrN), and the like. The thin film is generally used as a diffusion barrier between a silicon layer of a doped semiconductor and aluminum (Al) or copper (Cu) used as an interlayer wiring material. However, when depositing a tungsten (W) thin film on a substrate, the thin film serves as an adhesive layer.

To impart excellent and uniform physical properties to a thin film deposited on a substrate, the formed thin film must have high step coverage. Accordingly, the atomic layer deposition (ALD) process using surface reaction is used rather than the chemical vapor deposition (CVD) process using gas phase reaction, but there are still problems to be solved to realize 100% step coverage.

In addition, in the case of titanium tetrachloride ($TiCl_4$) used to deposit titanium nitride (TiN), which is a typical metal nitride, process by-products such as chlorides remain in a formed thin film, causing corrosion of metals such as aluminum. In addition, film quality is reduced due to generation of non-volatile by-products.

Therefore, it is necessary to develop a method of forming a thin film having a complex structure that does not cause corrosion of interlayer wiring materials and a semiconductor substrate fabricated by the method.

Related Art Documents

Patent Documents

KR 2006-0037241 A

DISCLOSURE

Technical Problem

Therefore, the present invention has been made in view of the above problems, and it is one object of the present invention to provide a thin film-forming growth inhibitor capable of inhibiting side reactions to appropriately reduce the growth rate of a thin film and capable of removing process by-products from a thin film to prevent corrosion or deterioration and greatly improve step coverage and the thickness uniformity of the thin film even when the thin film is formed on a substrate having a complicated structure, a method of forming a thin film using the growth inhibitor, and a semiconductor substrate fabricated by the method.

It is another object of the present invention to improve the density and electrical properties of a thin film by improving the crystallinity of the thin film.

The above and other objects can be accomplished by the present invention described below.

Technical Solution

In accordance with one aspect of the present invention, provided is a growth inhibitor for forming a thin film, wherein the growth inhibitor is a compound represented by Chemical Formula 1 below:

$$A_nB_mX_oY_iZ_j, \quad \text{[Chemical Formula 1]}$$

wherein A is carbon or silicon; B is hydrogen or an alkyl group having 1 to 3 carbon atoms; X includes one or more of fluorine (F), chlorine (Cl), bromine (Br), and iodine (I); Y and Z independently include one or more selected from the group consisting of oxygen, nitrogen, sulfur, and fluorine and are different from each other; n is an integer from 1 to 15; o is an integer greater than or equal to 1; m is 0 to 2n+1; and i and j are integers from 0 to 3.

In addition, the growth inhibitor for forming a thin film of the present invention may serve as a film quality improver.

In accordance with another aspect of the present invention, provided is a method of forming a thin film including injecting the growth inhibitor for forming a thin film into an ALD chamber and adsorbing the growth inhibitor on a surface of a loaded substrate.

In accordance with yet another aspect of the present invention, provided is a semiconductor substrate fabricated by the method of forming a thin film.

Advantageous Effects

According to the present invention, the present invention has an effect of providing a thin film-forming growth inhibitor capable of inhibiting side reactions and reducing deposition rate to appropriately reduce the growth rate of a thin film and capable of removing process by-products from a thin film to prevent corrosion or deterioration and greatly improve step coverage and the thickness uniformity of the thin film even when the thin film is formed on a substrate having a complicated structure, a method of forming a thin film using the growth inhibitor, and a semiconductor substrate fabricated by the method.

In addition, according to the present invention, the present invention can improve the density and electrical properties of a thin film by improving the crystallinity of the thin film.

DESCRIPTION OF DRAWINGS

FIG. 1 illustrates a conventional ALD process.

FIG. 2 illustrates an ALD process according to one embodiment of the present invention.

FIGS. 3 and 4 are SIMS analysis graphs showing the reduction rate of a Cl element and the like according to deposition temperatures in Example 1 (SP—TiCl$_4$) of the present invention and Comparative Example 1 (TiCl$_4$).

FIG. 5 is a TEM image showing cross sections near the top and bottom of a TiN thin film formed in Example 1 (SP—TiCl$_4$) of the present invention and Comparative Example 1 (TiCl$_4$).

FIG. 6 includes images for explaining the positions of the cross sections near the top and the bottom of FIG. 5.

FIG. 7 includes the SIMS analysis graphs of SiN thin films manufactured in Example 5 and Comparative Example 4.

FIG. 8 is an XRD analysis graph for a case (Ref TiN) in which no growth inhibitor for forming a thin film was added according to Comparative Example 1, a case (tert-BuI (0.1 g/min)) in which a growth inhibitor for forming a thin film was added in an amount of 0.1 g/min according to Example 4, and a case (tert-BuI (0.01 g/min)) in which a growth inhibitor for forming a thin film was added in an amount of 0.01 g/min according to Example 4.

FIG. 9 includes SIMS analysis graphs showing the reduction rates of fluorine (F) and carbon (C) elements depending on deposition time (Sputter Time) in Example 6 (SP—NbF$_5$) of the present invention and Comparative Example 5 (NbF$_5$) Here, the right graph shows a case in which a growth inhibitor for forming a thin film of the present invention is applied, and the left graph shows Comparative Example 5 corresponding to a reference without using the growth inhibitor for forming a thin film.

BEST MODE

Hereinafter, a growth inhibitor for forming a thin film, a method of forming a thin film using the growth inhibitor, and a semiconductor substrate fabricated by the method according to the present invention will be described in detail.

The present inventors confirmed that, when a halogen-substituted compound having a predetermined structure as a thin film growth inhibitor was adsorbed before adsorbing a precursor compound for forming a thin film on the surface of a substrate loaded into an ALD chamber, the growth rate of a thin film formed after deposition was greatly reduced, and thus step coverage was greatly improved, and halides remaining as process by-products were greatly reduced. In addition, the present inventors confirmed that, when a precursor compound for forming a thin film was adsorbed onto the surface of a substrate loaded into an ALD chamber, and then a halogen-substituted compound having a predetermined structure as a thin film growth inhibitor was adsorbed, contrary to expectations, the growth rate of a thin film formed by acting as a film quality improver was increased, halides remaining as process by-products were greatly reduced, and the density and resistivity of the thin film were greatly improved. Based on these results, the present inventors conducted further studies to complete the present invention.

The growth inhibitor for forming a thin film of the present invention is a compound represented by Chemical Formula 1 below:

A$n$B$m$X$o$Y$i$Z$j$     [Chemical Formula 1]

In Chemical Formula 1, A is carbon or silicon; B is hydrogen or an alkyl group having 1 to 3 carbon atoms; X includes one or more of fluorine (F), chlorine (Cl), bromine (Br), and iodine (I); Y and Z independently include one or more selected from the group consisting of oxygen, nitrogen, sulfur, and fluorine and are different from each other; n is an integer from 1 to 15; o is an integer greater than or equal to 1; m is 0 to 2n+1; and i and j are integers from 0 to 3. In this case, when forming a thin film, the growth rate of the thin film may be reduced by suppressing side reactions, and corrosion or deterioration may be prevented by removing process by-products from the thin film. Even when forming a thin film on a substrate having a complicated structure, step coverage and the thickness uniformity of the thin film may be greatly improved.

B is preferably hydrogen or a methyl group, n is preferably an integer from 2 to 15, more preferably an integer from 2 to 10, still more preferably an integer from 2 to 6, still more preferably an integer from 4 to 6. Within this range, the effect of removing process by-products may be increased, and step coverage may be excellent.

In Chemical Formula 1, X includes preferably one or more of bromine (Br) and iodine (I), more preferably iodine. In this case, side reactions may be suppressed, and process by-products may be removed more efficiently.

In Chemical Formula 1, o may be preferably an integer from 1 to 5, more preferably an integer from 1 to 3, still more preferably 1 or 2. Within this range, step coverage may be further improved by reducing deposition rate.

m is preferably 1 to 2n+1, more preferably 3 to 2n+1. Within this range, the effect of removing process by-products may be increased, and step coverage may be excellent.

As a preferred example, Y and Z independently include one or more selected from the group consisting of oxygen, nitrogen, and fluorine and are different from each other.

As a preferred example, both i and j are not 0 and may be an integer from 1 to 3.

The compound represented by Chemical Formula 1 may be a branched, cyclic, or aromatic compound, and as a specific example, may include preferably one or more selected from the group consisting of tert-butyl bromide, 1-methyl-1-bromocyclohexane, 1-iodopropane, 1-iodobutane, 1-iodo-2-methyl propane, 1-iodo-1-isopropylcyclohexane, 1-iodo-4-nitrobenzene, 1-iodo-4-methoxybenzene, 1-iodo-2-methylpentane, 1-iodo-4-trifuloromethylbenzene, tert-butyl iodide, 1-methyl-1-iodocyclohexane, 1-bromo-4-chlorobenzene, 1-bromopropane, 1-bromobutane, 1-bromopentane, 1-bromohexane, 1-bromo-2-methylpropane, 1-bromooctance, 1-bromonaphthalene, 1-bromo-4-iodobenzene, and 1-bromo-4-nitrobenzene. In this case, the effect of removing process by-products may be increased, and step coverage and film quality may be improved.

The compound represented by Chemical Formula 1 is preferably used in an atomic layer deposition (ALD) process. In this case, the compound may effectively protect the surface of a substrate by acting as a growth inhibitor without interfering with adsorption of the precursor compound for forming a thin film, and process by-products may be effectively removed.

Preferably, the compound represented by Chemical Formula 1 may be in a liquid state at room temperature (22° C.) and may have a density of 0.8 to 2.5 g/cm$^3$ or 0.8 to 1.5 g/cm$^3$, a vapor pressure (20° C.) of 0.1 to 300 mmHg or 1 to 300 mmHg, and a solubility (25° C.) of 200 mg/L or less in water. Within this range, step coverage, the thickness uniformity of a thin film, and film quality may be excellent.

More preferably, the compound represented by Chemical Formula 1 may have a density of 0.85 to 2.0 g/cm³ or 0.85 to 1.3 g/cm³, a vapor pressure (20° C.) of 1 to 260 mmHg, and a solubility (25° C.) of 160 mg/L or less in water. Within this range, the thickness uniformity of a thin film, step coverage, and film quality may be excellent.

The method of forming a thin film of the present invention includes a step of injecting a thin film-forming growth inhibitor represented by Chemical Formula 1 below into an ALD chamber and adsorbing the thin film-forming growth inhibitor on the surface of a loaded substrate:

$$A_nB_mX_oY_iZ_j \quad \text{[Chemical Formula 1]}$$

In Chemical Formula 1, A is carbon or silicon; B is hydrogen or an alkyl group having 1 to 3 carbon atoms; X includes one or more of fluorine (F), chlorine (Cl), bromine (Br), and iodine (I); Y and Z independently include one or more selected from the group consisting of oxygen, nitrogen, sulfur, and fluorine and are different from each other; n is an integer from 1 to 15; o is an integer greater than or equal to 1; m is 0 to 2n+1; and i and j are integers from 0 to 3. In this case, the growth rate of a thin film may be reduced by suppressing side reactions and reducing deposition rate. In addition, even when forming a thin film on a substrate having a complicated structure, by removing process by-products from the thin film, step coverage and the thickness uniformity of the thin film may be greatly improved.

In the step of adsorbing the growth inhibitor for forming a thin film on the surface of a substrate, when feeding the growth inhibitor for forming a thin film onto the surface of the substrate, the feeding time is preferably 1 to 10 seconds per cycle, more preferably 1 to 5 seconds per cycle, still more preferably 2 to 5 seconds per cycle, still more preferably 2 to 4 seconds per cycle. Within this range, the growth rate of a thin film may be reduced, and step coverage and economics may be excellent.

In the present disclosure, the feeding time of the growth inhibitor for forming a thin film is determined based on a chamber volume of 15 to 20 L and a flow rate of 0.5 to 5 mg/s, more specifically, based on a chamber volume of 18 L and a flow rate of 1 to 2 mg/s.

As a preferred example, the method of forming a thin film may include i) a step of vaporizing the growth inhibitor for forming a thin film and adsorbing the growth inhibitor on a surface of a substrate loaded into an ALD chamber; ii) a step of performing first purging of the inside of the ALD chamber using a purge gas; iii) a step of vaporizing a precursor compound for forming a thin film and adsorbing the precursor compound on the surface of the substrate loaded into the ALD chamber; iv) a step of performing second purging of the inside of the ALD chamber using a purge gas; v) a step of supplying a reaction gas into the ALD chamber; and vi) a step of performing third purging of the inside of the ALD chamber using a purge gas. In this case, the growth rate of a thin film may be appropriately reduced. In addition, even when deposition temperature is increased when forming a thin film, process by-products generated may be effectively removed, thereby reducing the resistivity of the thin film and greatly improving step coverage.

As another preferred example, the method of forming a thin film may include i) a step of vaporizing a precursor compound for forming a thin film and adsorbing the precursor compound on the surface of a substrate loaded into an ALD chamber; ii) a step of performing first purging of the inside of the ALD chamber using a purge gas; iii) a step of vaporizing the growth inhibitor for forming a thin film and adsorbing the growth inhibitor on the surface of the substrate loaded into the ALD chamber; iv) a step of performing second purging of the inside of the ALD chamber using a purge gas; v) a step of supplying a reaction gas into the ALD chamber; and vi) a step of performing third purging of the inside of the ALD chamber using a purge gas. In this case, the growth rate of a thin film may be increased. In addition, even when deposition temperature is increased when forming a thin film, process by-products generated may be effectively removed, thereby reducing the resistivity of the thin film and greatly improving the density of the thin film and step coverage.

The growth inhibitor for forming a thin film and precursor compound for forming a thin film may preferably be transferred into an ALD chamber by a VFC method, a DLI method, or an LDS method, more preferably be transferred into an ALD chamber by an LDS method.

The ratio of an amount (mg/cycle) of the growth inhibitor for forming a thin film to an amount (mg/cycle) of the precursor compound for forming a thin film fed into the ALD chamber may be preferably 1:1.5 to 1:20, more preferably 1:2 to 1:15, still more preferably 1:2 to 1:12, still more preferably 1:2.5 to 1:10. Within this range, the reduction rate of thin film growth rate per cycle (GPC) may be increased, and process by-products may be greatly reduced.

Precursor compounds for forming a thin film commonly used in an atomic layer deposition (ALD) method may be used as the precursor compound for forming a thin film according to the present invention without particular limitation. Preferably, as the precursor compound for forming a thin film, a metal film precursor compound, a metal oxide film precursor compound, a metal nitride film precursor compound, or a silicon nitride film precursor compound may be used. The metal may include preferably one or more selected from the group consisting of tungsten, cobalt, chromium, aluminum, hafnium, vanadium, niobium, germanium, lanthanides, actinoids, gallium, tantalum, zirconium, ruthenium, copper, titanium, nickel, iridium, and molybdenum.

For example, a thin film-forming precursor compound including niobium as the metal may be preferably $NbF_5$. In this case, the desired effect of the present invention may be well expressed.

For example, the metal film precursor, the metal oxide film precursor, and the metal nitride film precursor may independently include one or more selected from the group consisting of metal halides, metal alkoxides, alkyl metal compounds, metal amino compounds, metal carbonyl compounds, and substituted or unsubstituted cyclopentadienyl metal compounds, without being limited thereto.

As a specific example, the metal film precursor, the metal oxide film precursor, and the metal nitride film precursor may independently include one or more selected from the group consisting of tetrachlorotitan, tetrachlorogemanium, tetrachlorotin, tris(isopropyl)ethylmethyl aminogermanium, tetraethoxylgermanium, tetramethyl tin, tetraethyl tin, bisacetylacetonate tin, trimethylaluminum, tetrakis(dimethylamino)germanium, bis(n-butylamino) germanium, tetrakis(ethylmethylamino)tin, tetrakis(dimethylamino)tin, dicobalt octacarbonyl $(Co_2(CO)_8)$, biscyclopentadienylcobalt (Cp2Co), cobalt tricarbonyl nitrosyl $(Co(CO)_3NO)$, and cabalt dicarbonyl cyclopentadienyl $(CpCo(CO)_2)$, without being limited thereto.

For example the silicon nitride film precursor may include one or more selected from the group consisting of $SiH_4$, $SiCl_4$, $SiF_4$, $SiCl_2H_2$, $Si_2Cl_6$, TEOS, DIPAS, BTBAS, $(NH_2)Si(NHMe)_3$, $(NH_2)Si(NHEt)_3$, $(NH_2)Si(NH^nPr)_3$, $(NH_2)Si$ ($NH^iPr)_3$, $(NH_2)Si(NH''Bu)_3$, $(NH_2)Si(NH^tBu)_3$, $(NH_2)Si(NH^iBu)_3$, $(NMe_2)Si(NHMe)_3$, $(NMe_2)Si(NHEt)_3$, $(NMe_2)Si(NH''Pr)_3$, $(NMe_2)Si(NH^iPr)_3$, $(NMe_2)Si(NH''Bu)_3$, $(NMe_2)Si(NH^iBu)_3$, $(NMe_2)Si(NH^tBu)_3$, $(NEt_2)Si(NHMe)_3$, $(NEt_2)Si(NHEt)_3$, $(NEt_2)Si(NH''Pr)_3$, $(NEt_2)Si(NH^iPr)_3$, $(NEt_2)Si(NH''Bu)_3$, $(NEt_2)Si(NH^iBu)_3$, $(NEt_2)Si(NH^tBu)_3$, $(N''Pr_2)Si(NHMe)_3$, $(N''Pr_2)Si(NHEt)_3$, $(N''Pr_2)Si(NH''Pr)_3$, $(N''Pr_2)Si(NH^iPr)_3$, $(N''Pr_2)Si(NH''Bu)_3$, $(N''Pr_2)Si(NH^iBu)_3$, $(N''Pr_2)Si(NH^tBu)_3$, $(N^iPr_2)Si(NHMe)_3$, $(N^iPr_2)Si(NHEt)_3$, $(N^iPr_2)Si(NH''Pr)_3$, $(N^iPr_2)Si(NH^iPr)_3$, $(N^iPr_2)Si(NH''Bu)_3$, $(N^iPr_2)Si(NH^iBu)_3$, $(N^iPr_2)Si(NH^tBu)_3$, $(N''Bu_2)Si(NHMe)_3$, $(N''Bu_2)Si(NHEt)_3$, $(N''Bu_2)Si(NH''Pr)_3$, $(N''Bu_2)Si(NH^iPr)_3$, $(N''Bu_2)Si(NH''Bu)_3$, $(N''Bu_2)Si(NH^iBu)_3$, $(N''Bu_2)Si(NH^tBu)_3$, $(N^iBu_2)Si(NHMe)_3$, $(N^iBu_2)Si(NHEt)_3$, $(N^iBu_2)Si(NH''Pr)_3$, $(N^iBu_2)Si(NH^iPr)_3$, $(N^iBu_2)Si(NH''Bu)_3$, $(N^iBu_2)Si(NH^iBu)_3$, $(N^iBu_2)Si(NH^tBu)_3$, $(N^tBu_2)Si(NHMe)_3$, $(N^tBu_2)Si(NHEt)_3$, $(N^tBu_2)Si(NH''Pr)_3$, $(N^tBu_2)Si(NH^iPr)_3$, $(N^tBu_2)Si(NH''Bu)_3$, $(N^tBu_2)Si(NH^iBu)_3$, $(N^tBu_2)Si(NH^tBu)_3$, $(NH_2)_2Si(NHMe)_2$, $(NH_2)_2Si(NHEt)_2$, $(NH_2)_2Si(NH''Pr)_2$, $(NH_2)_2Si(NH^iPr)_2$, $(NH_2)_2Si(NH''Bu)_2$, $(NH_2)_2Si(NH^iBu)_2$, $(NH_2)_2Si(NH^tBu)_2$, $(NMe_2)_2Si(NHMe)_2$, $(NMe_2)_2Si(NHEt)_2$, $(NMe_2)_2Si(NH''Pr)_2$, $(NMe_2)_2Si(NH^iPr)_2$, $(NMe_2)_2Si(NH''Bu)_2$, $(NMe_2)_2Si(NH^iBu)_2$, $(NMe_2)_2Si(NH^tBu)_2$, $(NEt_2)_2Si(NHMe)_2$, $(NEt_2)_2Si(NHEt)_2$, $(NEt_2)_2Si(NH''Pr)_2$, $(NEt_2)_2Si(NH^iPr)_2$, $(NEt_2)_2Si(NH''Bu)_2$, $(NEt_2)_2Si(NH^iBu)_2$, $(NEt_2)_2Si(NH^tBu)_2$, $(N''Pr_2)_2Si(NHMe)_2$, $(N''Pr_2)_2Si(NHEt)_2$, $(N''Pr_2)_2Si(NH''Pr)_2$, $(N''Pr_2)_2Si(NH^iPr)_2$, $(N''Pr_2)_2Si(NH''Bu)_2$, $(N''Pr_2)_2Si(NH^iBu)_2$, $(N''Pr_2)_2Si(NH^tBu)_2$, $(N^iPr_2)_2Si(NHMe)_2$, $(N^iPr_2)_2Si(NHEt)_2$, $(N^iPr_2)_2Si(NH''Pr)_2$, $(N^iPr_2)_2Si(NH^iPr)_2$, $(N^iPr_2)_2Si(NH''Bu)_2$, $(N^iPr_2)_2Si(NH^iBu)_2$, $(N^iPr_2)_2Si(NH^tBu)_2$, $(N''Bu_2)_2Si(NHMe)_2$, $(N''Bu_2)_2Si(NHEt)_2$, $(N''Bu_2)_2Si(NH''Pr)_2$, $(N''Bu_2)_2Si(NH^iPr)_2$, $(N''Bu_2)_2Si(NH''Bu)_2$, $(N''Bu_2)_2Si(NH^iBu)_2$, $(N''Bu_2)_2Si(NH^tBu)_2$, $(N^iBu_2)_2Si(NHMe)_2$, $(N^iBu_2)_2Si(NHEt)_2$, $(N^iBu_2)_2Si(NH''Pr)_2$, $(N^iBu_2)_2Si(NH^iPr)_2$, $(N^iBu_2)_2Si(NH''Bu)_2$, $(N^iBu_2)_2Si(NH^iBu)_2$, $(N^iBu_2)_2Si(NHMe)_2$, $(N^tBu_2)_2Si(NHEt)_2$, $(N^tBu_2)_2Si(NH''Pr)_2$, $(N^tBu_2)_2Si(NH^iPr)_2$, $(N^tBu_2)_2Si(NH''Bu)_2$, $(N^tBu_2)_2Si(NH^iBu)_2$, $(N^tBu_2)_2Si(NH''Bu)_2$, $Si(HNCH_2CH_2NH)_2$, $Si(MeNCH_2CH_2NMe)_2$, $Si(EtNCH_2CH_2NEt)_2$, $Si(''PrNCH_2CH_2N''Pr)_2$, $Si(^iPrNCH_2CH_2N^iPr)_2$, $Si(''BuNCH_2CH_2N''Bu)_2$, $Si(^iBuNCH_2CH_2N^iBu)_2$, $Si(^tBuNCH_2CH_2N^tBu)_2$, $Si(HNCHCHNH)_2$, $Si(MeNCHCHNMe)_2$, $Si(EtNCHCHNEt)_2$, $Si(''PrNCHCHN''Pr)_2$, $Si(^iPrNCHCHN^iPr)_2$, $Si(''BuNCHCHN''Bu)_2$, $Si(^iBuNCHCHN^iBu)_2$, $Si(^tBuNCHCHN^tBu)_2$, $(HNCHCHNH)Si(HNCH_2CH_2NH)$, $(MeNCHCHNMe)Si(MeNCH_2CH_2NMe)$, $(EtNCHCHNEt)Si(EtNCH_2CH_2NEt)$, $(''PrNCHCHN''Pr)Si(''PrNCH_2CH_2N''Pr)$, $(^iPrNCHCHN^iPr)Si(^iPrNCH_2CH_2N^iPr)$, $(''BuNCHCHN''Bu)Si(''BuNCH_2CH_2N''Bu)$, $(^iBuNCHCHN^iBu)Si(^iBuNCH_2CH_2N^iBu)$, $(^tBuNCHCHN^tBu)Si(^tBuNCH_2CH_2N^tBu)$, $(NH^tBu)_2Si(HNCH_2CH_2NH)$, $(NH^tBu)_2Si(MeNCH_2CH_2NMe)$, $(NH^tBu)_2Si(EtNCH_2CH_2NEt)$, $(NH^tBu)_2Si(''PrNCH_2CH_2N''Pr)$, $(NH^tBu)_2Si(^iPrNCH_2CH_2N^iPr)$, $(NH^tBu)_2Si(''BuNCH_2CH_2N''Bu)$, $(NH^tBu)_2Si(^iBuNCH_2CH_2N^iBu)$, $(NH^tBu)_2Si(^tBuNCH_2CH_2N^tBu)$, $(NH^tBu)_2Si(HNCHCHNH)$, $(NH^tBu)_2Si(MeNCHCHNMe)$, $(NH^tBu)_2Si(EtNCHCHNEt)$, $(NH^tBu)_2Si(''PrNCHCHN''Pr)$, $(NH^tBu)_2Si(^iPrNCHCHN^iPr)$, $(NH^tBu)_2Si(''BuNCHCHN''Bu)$, $(NH^tBu)_2Si(^iBuNCHCHN^iBu)$, $(NH^tBu)_2Si(^tBuNCHCHN^tBu)$, $(^iPrNCH_2CH_2N^iPr)Si(NHMe)_2$, $(^iPrNCH_2CH_2N^iPr)Si(NHEt)_2$, $(^iPrNCH_2CH_2N^iPr)Si(NH''Pr)_2$, $(^iPrNCH_2CH_2N^iPr)Si(NH^iPr)_2$, $(^iPrNCH_2CH_2N^iPr)Si(NH''Bu)_2$, $(^iPrNCH_2CH_2N^iPr)Si(NH^iBu)_2$, $(^iPrNCH_2CH_2N^iPr)Si(NH^tBu)_2$, $(^iPrNCHCHN^iPr)Si(NHMe)_2$, $(^iPrNCHCHN^iPr)Si(NHEt)_2$, $(^iPrNCHCHN^iPr)Si(NH''Pr)_2$, $(^iPrNCHCHN^iPr)Si(NH^iPr)_2$, $(^iPrNCHCHN^iPr)Si(NH''Bu)_2$, $(^iPrNCHCHN^iPr)Si(NH^iBu)_2$, and $(^iPrNCHCHN^iPr)Si(NH^tBu)_2$, without being limited thereto.

Here, ''Pr means n-propyl, $^i$Pr means iso-propyl, ''Bu means n-butyl, $^i$Bu means iso-butyl, and $^t$Bu means tert-butyl.

As a preferred example, the precursor compound for forming a thin film may be a titanium tetrahalide.

The titanium tetrahalide may be used as a metal precursor of a composition for forming a thin film. For example, the titanium tetrahalide may be at least one selected from the group consisting of $TiF_4$, $TiCl_4$, $TiBr_4$, and $TiI_4$. As a preferred example, considering economic feasibility, the titanium tetrahalide is $TiCl_4$, but the present invention is not limited thereto.

Since the titanium tetrahalide does not decompose at room temperature due to excellent thermal stability thereof and exists in a liquid state, the titanium tetrahalide may be used as a precursor for depositing a thin film according to atomic layer deposition (ALD).

For example, the precursor compound for forming a thin film may be fed into a chamber after being mixed with a non-polar solvent. In this case, the viscosity of the precursor compound for forming a thin film or vapor pressure may be easily adjusted.

The non-polar solvent may include preferably one or more selected from the group consisting of alkanes and cycloalkanes. In this case, step coverage may be improved even when deposition temperature is increased when forming a thin film while containing an organic solvent having low reactivity and solubility and capable of easy moisture management.

As a more preferred example, the non-polar solvent may include a C1 to C10 alkane or a C3 to C10 cycloalkane, preferably a C3 to C10 cycloalkane. In this case, reactivity and solubility may be reduced, and moisture management may be easy.

In the present disclosure, C1, C3, and the like mean the carbon number.

The cycloalkane may be preferably a C3 to C10 mono-cycloalkane. Among the monocycloalkanes, cyclopentane exists in a liquid state at room temperature and has the highest vapor pressure, and thus is preferable in a vapor deposition process. However, the present invention is not limited thereto.

For example, the non-polar solvent has a solubility (25° C.) of 200 mg/L or less, preferably 50 to 200 mg/L, more preferably 135 to 175 mg/L in water. Within this range, reactivity to the precursor compound for forming a thin film may be low, and moisture management may be easy.

In the present disclosure, solubility may be measured without particular limitation according to measurement methods or standards commonly used in the art to which the present invention pertains. For example, solubility may be measured according to the HPLC method using a saturated solution.

Based on a total weight of the precursor compound for forming a thin film and the non-polar solvent, the non-polar solvent may be included in an amount of preferably 5 to 95% by weight, more preferably 10 to 90% by weight, still more preferably 40 to 90% by weight, most preferably 70 to 90% by weight.

When the content of the non-polar solvent exceeds the above range, impurities are generated to increase resistance and impurity levels in a thin film. When the content of the non-polar solvent is less than the above range, an effect of improving step coverage and reducing an impurity such as chlorine (Cl) ion due to addition of the solvent may be reduced.

For example, in the method of forming a thin film, the rate of decrease in thin film growth rate per cycle (Å/Cycle) calculated by Equation 1 below is −5% or less, preferably −10% or less, more preferably −20% or less, still more preferably −30% or less, still more preferably −40% or less, most preferably −45% or less. Within this range, step coverage and the thickness uniformity of the film may be excellent.

Rate of decrease in thin film growth rate per cycle (%)=[(Thin film growth rate per cycle when a growth inhibitor for forming a thin film is used−Thin film growth rate per cycle when a growth inhibitor for forming a thin film is not used)/Thin film growth rate per cycle when a growth inhibitor for forming a thin film is not used]×100    [Equation 1]

In the method of forming a thin film, residual halogen intensity (c/s) in a thin film formed after 200 cycles, measured based on SIMS, may be preferably 10,000 or less, more preferably 8,000 or less, still more preferably 7,000 or less, still more preferably 6,000 or less. Within this range, the effect of preventing corrosion and deterioration may be excellent.

In the present disclosure, purging may be performed preferably at 1,000 to 10,000 sccm, more preferably at 2,000 to 7,000 sccm, still more preferably at 2,500 to 6,000 sccm. Within this range, a thin film growth rate per cycle may be reduced to a desirable range, and process by-products may be reduced.

The atomic layer deposition (ALD) process is very advantageous in fabricating integrated circuits (ICs) requiring a high aspect ratio, and in particular, due to a self-limiting thin film growth mechanism, excellent conformality and uniformity and precise thickness control may be achieved.

For example, in the method of forming a thin film, the deposition temperature may be 50 to 900° C., preferably 300 to 700° C., more preferably 350 to 600° C., still more preferably 400 to 550° C., still more preferably 400 to 500° C. Within this range, an effect of growing a thin film having excellent film quality may be obtained while implementing ALD process characteristics.

For example, in the method of forming a thin film, the deposition pressure may be 0.1 to 10 torr, preferably 0.5 to 5 torr, most preferably 1 to 3 torr. Within this range, a thin film having a uniform thickness may be obtained.

In the present disclosure, the deposition temperature and the deposition pressure may be temperature and pressure in a deposition chamber or temperature and pressure applied to a substrate in a deposition chamber.

The method of forming a thin film may preferably include a step of increasing temperature in a chamber to a deposition temperature before introducing the growth inhibitor for forming a thin film into the chamber; and/or a step of performing purging by injecting an inert gas into the chamber before introducing the growth inhibitor for forming a thin film into the chamber.

In addition, the present invention may include an apparatus for forming a thin film including an ALD chamber as a thin film-forming apparatus capable of implementing the method of forming a thin film, a first vaporizer for vaporizing a growth inhibitor for forming a thin film, a first transfer means for transferring the vaporized growth inhibitor for forming a thin film into the ALD chamber, a second vaporizer for vaporizing a Ti-based thin film precursor, and a second transfer means for transferring the vaporized Ti-based thin film precursor into the ALD chamber. Here, vaporizers and transfer means commonly used in the art to which the present invention pertains may be used without particular limitation.

As a specific example, the method of forming a thin film is described in detail as follows.

First, a substrate on which a thin film is to be formed is placed in a deposition chamber capable of performing atomic layer deposition.

The substrate may include a semiconductor substrate such as a silicon substrate or a silicon oxide substrate.

A conductive layer or an insulating layer may be further formed on the substrate.

To deposit a thin film on the substrate placed in the deposition chamber, the growth inhibitor for forming a thin film and a precursor compound for forming a thin film or a mixture of the precursor compound for forming a thin film and a non-polar solvent are prepared, respectively.

Then, the prepared inhibitor for forming a thin film is injected into a vaporizer, converted into a vapor phase, transferred to a deposition chamber, and adsorbed on the substrate. Then, the non-adsorbed inhibitor for forming a thin film is purged.

Next, the prepared precursor compound for forming a thin film or a mixture of the precursor compound for forming a thin film and a non-polar solvent is injected into a vaporizer, converted into a vapor phase, transferred to a deposition chamber, and adsorbed on the substrate. Then, the non-adsorbed composition for forming a thin film is purged.

In the present disclosure, for example, when the inhibitor for forming a thin film and the precursor compound for forming a thin film are transferred to a deposition chamber, a vapor flow control (VFC) method using a mass flow control (MFC) method, or a liquid delivery system (LDS) using a liquid mass flow control (LMFC) method may be used. Preferably, the LDS method is used.

In this case, one selected from argon (Ar), nitrogen ($N_2$), and helium (He) or a mixed gas of two or more thereof may be used as a transport gas or a diluent gas for moving the inhibitor for forming a thin film or the precursor compound for forming a thin film onto the substrate, but the present invention is not limited thereto.

In the present disclosure, for example, an inert gas may be used as the purge gas, and the transport gas or the dilution gas may be preferably used as the purge gas.

Next, a reaction gas is supplied. Reaction gases commonly used in the art to which the present invention pertains may be used as the reaction gas of the present invention without particular limitation. Preferably, the reaction gas may include a reducing agent, a nitrifying agent, or an oxidizing agent. A metal thin film is formed by reacting the reducing agent with the precursor compound for forming a thin film adsorbed on the substrate, a metal nitride thin film is formed by the nitrifying agent, and a metal oxide thin film is formed by the oxidizing agent.

Preferably, the reducing agent may be an ammonia gas ($NH_3$) or a hydrogen gas ($H_2$), the nitrifying agent may be a nitrogen gas ($N_2$), and the oxidizing agent may include one or more selected from the group consisting of $H_2O$, $H_2O_2$, $O_2$, $O_3$, and $N_2O$.

Next, the unreacted residual reaction gas is purged using an inert gas. Accordingly, in addition to the excess reaction gas, produced by-products may also be removed.

As described above, the step of adsorbing an inhibitor for forming a thin film on a substrate, the step of purging the unadsorbed inhibitor for forming a thin film, the step of adsorbing a precursor compound for forming a thin film on the substrate, the step of purging the unadsorbed composition for forming a thin film, the step of supplying a reaction gas, and the step of purging the remaining reaction gas may be set as a unit cycle. The unit cycle may be repeatedly performed to form a thin film having a desired thickness.

For example, the unit cycle may be performed 100 to 1,000 times, preferably 100 to 500 times, more preferably 150 to 300 times. Within this range, desired thin film properties may be effectively expressed.

FIG. 1 below illustrates a conventional ALD process, and FIG. 2 below illustrates an ALD process according to one embodiment of the present invention. Referring to FIG. 1, as in the conventional ALD process, when the surface of a substrate is not protected by adsorbing the growth inhibitor for forming a thin film according to the present invention before adsorbing a precursor compound (e.g., TiCl$_4$) for forming a thin film, a process by-product such as HCl remains in a thin film (e.g., TiN) formed by reacting with a reaction gas (e.g., NH$_3$), which causes corrosion or deterioration, thereby degrading the performance of a substrate. However, as shown in FIG. 2, when the surface of a substrate is protected by adsorbing the growth inhibitor (TSI) for forming a thin film according to the present invention before adsorbing a precursor compound (e.g., TiCl$_4$) for forming a thin film (Surface Protection; SP), process by-products such as HCl generated by reacting with a reaction gas (e.g., NH$_3$) when forming a thin film (e.g., TiN) are removed along with the growth inhibitor for forming a thin film, thereby preventing corrosion or deterioration of the substrate and appropriately reducing thin film growth rate per cycle to improve step coverage and the thickness uniformity of a thin film.

A semiconductor substrate of the present invention is fabricated by the method of forming a thin film according to the present invention. In this case, by suppressing side reactions, the growth rate of a thin film may be appropriately reduced. In addition, by removing process by-products from a thin film, corrosion or deterioration may be prevented, step coverage may be excellent, and thickness uniformity of the thin film may be greatly improved.

Preferably, the formed thin film has a thickness of 20 nm or less, a resistivity value of 0.1 to 400 μΩ·cm, a halogen content of 10,000 ppm or less, and a step coverage of 90% or more. Within this range, the thin film has excellent performance as a diffusion barrier and may reduce corrosion of metal wiring materials, but the present invention is not limited thereto.

For example, the thin film may have a thickness of 5 to 20 nm, preferably 10 to 20 nm, more preferably 15 to 18.5 nm, still more preferably 17 to 18.5 nm. Within this range, thin film properties may be excellent.

For example, the thin film may have a resistivity value of 0.1 to 400 μΩ·cm, preferably 50 to 400 μΩ·cm, more preferably 100 to 300 μΩ·cm. Within this range, thin film properties may be excellent.

The thin film may have a halogen content of preferably 9,000 ppm or less or 1 to 9,000 ppm, more preferably 8,500 ppm or less or 100 to 8,500 ppm, still more preferably 8,200 ppm or less or 1,000 to 8,200 ppm. Within this range, thin film properties may be excellent, and corrosion of metal wiring materials may be reduced.

For example, the thin film has a step coverage of 80% or more, preferably 90% or more, more preferably 92% or more. Within this range, even a thin film with a complex structure may be easily deposited on a substrate. Thus, the thin film may be applied to next-generation semiconductor devices.

For example, the formed thin film may be a TiN or TiO$_2$ thin film.

Hereinafter, the present invention will be described in more detail with reference to the following preferred examples and drawings. However, these examples and drawings are provided for illustrative purposes only and should not be construed as limiting the scope and spirit of the present invention. In addition, it will be apparent to those skilled in the art that various changes and modifications may be made without departing from the spirit and scope of the present invention, and such changes and modifications are also within the scope of the appended claims.

EXAMPLES

Examples 1 to 3

A growth inhibitor for forming a thin film shown in Table 1 below and TiCl$_4$ as a precursor compound for forming a thin film were prepared. The prepared growth inhibitor for forming a thin film was placed in a canister and supplied to a vaporizer heated to 150° C. at a flow rate of 0.05 g/min using a liquid mass flow controller (LMFC) at room temperature. The growth inhibitor for forming a thin film vaporized in the vaporizer was fed into a deposition chamber loaded with a substrate for 1 second, and then argon gas was supplied thereto at 5,000 sccm for 2 seconds to perform argon purging. At this time, the pressure in the reaction chamber was controlled to 2.5 torr. Next, the prepared TiCl$_4$ was placed in a separate canister and supplied to a separate vaporizer heated to 150° C. at a flow rate of 0.05 g/min using a liquid mass flow controller (LMFC) at room temperature. The TiCl$_4$ vaporized in the vaporizer was fed into the deposition chamber for 1 second, and then argon gas was supplied thereto at 5,000 sccm for 2 seconds to perform argon purging. At this time, the pressure in the reaction chamber was controlled to 2.5 torr. Next, after introducing ammonia as a reactive gas into the reaction chamber at 1,000 sccm for 3 seconds, argon purging was performed for 3 seconds. At this time, the substrate on which a metal thin film is to be formed was heated to 460° C. This process was repeated 200 times to form a TiN thin film as a self-limiting atomic layer.

TABLE 1

| Classification | Growth inhibitor for forming thin film |
| --- | --- |
| Example 1 | Tert-butyl bromide |
| Example 2 | 1-methyl-1-bromocyclohexane |
| Examples 3 to 5 | Tert-butyl iodide |

Example 4

A growth inhibitor for forming a thin film shown in Table 1 and TiCl$_4$ as a precursor compound for forming a thin film were prepared. The prepared growth inhibitor for forming a thin film was placed in a canister and supplied to a vaporizer heated to 150° C. at a flow rate of 0.05 g/min using a liquid mass flow controller (LMFC) at room temperature. The prepared TiCl$_4$ was placed in a separate canister and supplied to a separate vaporizer heated to 150° C. at a flow rate of 0.05 g/min using a liquid mass flow controller (LMFC) at room temperature.

The TiCl$_4$ vaporized in the vaporizer was fed into a deposition chamber for 1 second, and then argon gas was supplied thereto at 5,000 sccm for 2 seconds to perform argon purging. At this time, the pressure in the reaction chamber was controlled to 2.5 torr. Next, the growth inhibitor for forming a thin film vaporized in the vaporizer was fed into the deposition chamber loaded with a substrate for 1 second, and then argon gas was supplied thereto at 5,000 sccm for 2 seconds to perform argon purging. At this time, the pressure in the reaction chamber was controlled to 2.5 torr. Next, after introducing ammonia as a reactive gas into the reaction chamber at 1,000 sccm for 3 seconds, argon purging was performed for 3 seconds. At this time, the substrate on which a metal thin film is to be formed was heated to 440 to 500° C. This process was repeated 200 times to form a TiN thin film as a self-limiting atomic layer.

Example 5

A growth inhibitor for forming a thin film shown in Table 1 and Si$_2$Cl$_6$ as a precursor compound for forming a thin film were prepared. The prepared growth inhibitor for forming a thin film was placed in a canister and supplied to a vaporizer heated to 150° C. at a flow rate of 0.05 g/min using a liquid mass flow controller (LMFC) at room temperature. The prepared Si$_2$Cl$_6$ was placed in a separate canister and supplied to a separate vaporizer heated to 150° C. at a flow rate of 0.05 g/min using a liquid mass flow controller (LMFC) at room temperature.

The growth inhibitor for forming a thin film vaporized in the vaporizer was fed into a deposition chamber loaded with a substrate for 1 second, and then argon gas was supplied thereto at 5,000 sccm for 2 seconds to perform argon purging. At this time, the pressure in the reaction chamber was controlled to 2.5 torr. Next, the Si$_2$Cl$_6$ vaporized in the vaporizer was fed into the deposition chamber for 1 second, and then argon gas was supplied thereto at 5,000 sccm for 2 seconds to perform argon purging. At this time, the pressure in the reaction chamber was controlled to 2.5 torr. Next, after introducing ammonia as a reactive gas into the reaction chamber at 1,000 sccm for 3 seconds, 200 W plasma treatment was performed. Then, argon purging was performed for 3 seconds. At this time, the substrate on which a metal thin film is to be formed was heated to 460° C. This process was repeated 300 times to form an SiN thin film as a self-limiting atomic layer.

Example 6

An NbN thin film as a self-limiting atomic layer was formed in the same manner as in Example 1, except that tert-butyl chloride was used as a growth inhibitor for forming a thin film, NbF$_5$ was used as a precursor compound for forming a thin film, and vaporization was performed by the VFC method instead of the LDS method.

Comparative Example 1

A TiN thin film was formed on a substrate in the same manner as in Example 1, except that the growth inhibitor for forming a thin film was not used, and the step of purging the unadsorbed growth inhibitor for forming a thin film was omitted.

Comparative Examples 2 and 3

A TiN thin film was formed on a substrate in the same manner as in Example 1, except that pentane or cyclopentane was used instead of the growth inhibitor for forming a thin film shown in Table 1.

Comparative Example 4

An SiN thin film was formed on a substrate in the same manner as in Example 5, except that the growth inhibitor for forming a thin film was not used, and the step of purging the unadsorbed growth inhibitor for forming a thin film was omitted.

Comparative Example 5

An NbN thin film as a self-limiting atomic layer was formed in the same manner as in Example 6, except that the growth inhibitor for forming a thin film was not used.

EXPERIMENTAL EXAMPLES

1) Deposition Evaluation

As shown in Table 2 below, Example 1 using tert-butyl bromide as a growth inhibitor for forming a thin film and Comparative Example 1 without the growth inhibitor were compared. As a result, the deposition rate of Example 1 was 0.19 Å/cycle, which was reduced by 40% or more compared to Comparative Example 1. It was confirmed that Examples 2, 3, and 5 also had deposition rates similar to that of Example 1. In addition, it was confirmed that Comparative Examples 2 and 3 using pentane or cyclopentane instead of the growth inhibitor for forming a thin film according to the present invention also had the same deposition rate as Comparative Example 1. In this case, since decrease in deposition rate means to change CVD deposition characteristics to ALD deposition characteristics, decrease in deposition rate may be used as an index for improving step coverage characteristics.

In addition, when comparing Example 5 and Comparative Example 4 with reference to Table 2 below to confirm whether the same effect is implemented in the SiN thin film, as a result, the deposition rates of Example 5 and Comparative Example 4 are respectively 0.29 Å/cycle to 0.32 Å/cycle. That is, Example 5 exhibits a deposition rate reduced by 10% or more compared to Comparative Example 4.

FIG. 7 below is SIMS analysis graphs of SiN thin films prepared in Example 5 and Comparative Example 4. It was confirmed that Cl was significantly reduced in Example 5 corresponding to the right graph compared to Comparative Example 4 corresponding to the left graph.

In addition, referring to Table 2 below, in the case of Example 4 in which a source precursor, i.e., a thin film precursor was first adsorbed, purging was performed using argon gas, and then tert-butyl iodide as a growth inhibitor for forming a thin film was supplied, compared to Comparative Example 1 in which the growth inhibitor for forming a thin film was not used, deposition rate increased by nearly 10% from 0.32 Å/cycle to 0.35 Å/cycle, and the deposition rate increased by nearly 16% to 0.37 Å/cycle when deposition temperature was increased to 500° C.

Compared to Comparative Example 1, in Example 4, the deposition rate rather increased. Unlike the prior art, this result was an unexpected phenomenon that impurities did not increase but rather decreased as the deposition rate increased. It was confirmed that another great advantage may be provided when this phenomenon is linked to a through-put aspect.

TABLE 2

| Classification | Growth inhibitor | Type of thin film | Deposition rate (Å/cycle) |
|---|---|---|---|
| Example 1 | Tert-butyl bromide | TiN | 0.19 |
| Example 2 | 1-methyl-1-bromocyclohexane | TiN | 0.23 |
| Example 3 | Tert-butyl iodide | TiN | 0.28 |
| Example 4 | Tert-butyl iodide | TiN | 0.35 |
| Example 5 | Tert-butyl iodide | SiN | 0.29 |
| Comparative Example 1 | X | TiN | 0.32 |
| Comparative Example 2 | Pentane | TiN | 0.32 |
| Comparative Example 3 | Cyclopentane | TiN | 0.32 |
| Comparative Example 4 | X | SiN | 0.35 |

2) Impurity Reduction Characteristics

To compare the impurity reduction characteristics of the TiN thin films deposited according to Examples 1 to 5 and Comparative Examples 1 and 2, that is, the characteristics of reducing process by-products, SIMS analysis was performed, and the results are shown in Table 4 and FIGS. 3 and 4 below. Here, Cl reduction rate (%) was calculated by Equation 2 below.

$$\text{Cl reduction rate} = \frac{\textit{SIMS} \text{ Cl intensity of Comparative Example 1} - \textit{SIMS} \text{ Cl intensity of Example}}{\textit{SIMS} \text{ Cl intensity of Example}} \times 100 \quad [\text{Equation 2}]$$

Reference thickness of sample thin film: 10 nm. As shown in Table 3, in the case of Examples 1 to 5 using the growth inhibitor for forming a thin film according to the present invention, compared to Comparative Examples 1 and 2 in which the growth inhibitor was not used, Cl intensity was greatly reduced, indicating that impurity reduction characteristics are excellent.

In addition, comparing Examples 3 and 4, it was confirmed that the process method of Example 4 was very advantageous in reducing impurities.

In addition, FIGS. 3 and 4 below are graphs showing process by-product reduction characteristics, i.e., Cl reduction rate depending on deposition temperature according to Example 1 and Comparative Example 1. When the growth inhibitor for forming a thin film according to the present invention was used, compared to a case in which the growth inhibitor for forming a thin film according to the present invention was not used, at all deposition temperatures, especially in the range of 480 to 520° C., Cl intensity decreased significantly.

In addition, as shown in FIG. 9 below, in the case of Example 6 in which the growth inhibitor (tert-butyl chloride) for forming a thin film according to the present invention was used, and an Nb thin film precursor was used as the thin film precursor, compared to Comparative Example 5 (Ref NbF$_5$) in which the growth inhibitor for forming a thin film was not used, F, which was a contaminant in the film, and C intensity (c/s) were greatly reduced, indicating that impurity reduction characteristics were excellent. More specifically, compared to Comparative Example 5 (F(c/s)=116,925.65, C(c/s)=1,466), which was a reference, in the case of Example 6 (F(c/s)=75,197, C(c/s) =656) using NbF$_5$ as thin film precursor, F, which was a contaminant in the film, and C intensity were reduced by 35% and 55%, respectively, indicating that the Nb thin film according to the present invention had excellent impurity reduction characteristics.

3) Rate of Decrease in Thin Film Growth Rate

When measuring the growth rates of the TiN thin films deposited in Examples 1 to 5 and Comparative Examples 1 and 2, the thickness of the TiN thin film was measured by the Ellipsometry method. Then, based on the measurement results, the rate of decrease in thin film growth rate was calculated by Equation 1 below, and the results are shown in Table 4 below.

$$\text{Rate of decrease in thin film growth rate per cycle (\%)} = [(\text{Thin film growth rate per cycle when a growth inhibitor for forming a thin film is used} - \text{Thin film growth rate per cycle when a growth inhibitor for forming a thin film is not used})/\text{Thin film growth rate per cycle when a growth inhibitor for forming a thin film is not used}] \times 100 \quad [\text{Equation 1}]$$

TABLE 3

| Classification | | Example 1 | Example 2 | Example 3 | Example 4 | Example 5 | Comparative Example 1 | Comparative Example 2 |
|---|---|---|---|---|---|---|---|---|
| Cl reduction rate (Cl intensity (c/s)) | 460° C. | 48.2% (8043) | 34.5% (10174) | 39.0% (9475) | 56% (6633) | 42.8% (712) | 0% (15538) | 0% (1246) |
| | 500° C. | 68.9% (2728) | 24.9% (6589) | — | — | — | 0% (8781) | — |
| | 550° C. | 49.7% (1591) | 21.4% (2491) | — | — | — | 0% (3169) | — |

TABLE 4

| Classification | Example 1 | Example 2 | Example 3 | Example 4 | Example 5 | Comparative Example 1 | Comparative Example 2 |
|---|---|---|---|---|---|---|---|
| Rate of decrease in thin film growth rate per cycle (GPC) (%) | 40 | 28 | 12.5 | −9.3 | 17 | 0 | 0 |

As shown in Table 4, a rate of decrease in thin film growth rate per cycle of Examples 1 to 3 using the growth inhibitor for forming a thin film according to the present invention is 10 to 40% of that of Comparative Example 1 in which the growth inhibitor was not used. This data indicates that Examples 1 to 3 are excellent in terms of the rate of decrease in thin film growth rate per cycle. In addition, comparing Example 5 and Comparative Example 2, a rate of decrease in thin film growth rate per cycle of Example 5 is 17% of that of Comparative Example 2, indicating that Example 5 is excellent in terms of the rate of decrease in thin film growth rate per cycle. In addition, when comparing Example 4 with Comparative Example 1 when the process method is different, compared to Comparative Example 1, in Example 4, the deposition rate rather increases. Unlike the prior art, impurities are reduced even when the deposition rate increases. Thus, another great advantage may be provided when this phenomenon is linked to a through-put aspect.

4) Step Coverage Characteristics

The step coverage of the TiN thin films deposited in Example 1 and Comparative Example 1 was confirmed using a TEM, and the results are shown in Table 5 and FIG. 5 below.

TABLE 5

| Classification | Example 1 | Comparative Example 1 |
|---|---|---|
| Step coverage (%) | 84 | 48 |

As shown in Table 5, in the case of Example 1 using the growth inhibitor for forming a thin film according to the present invention, compared to Comparative Example 1 in which the growth inhibitor was not used, step coverage was significantly increased. In addition, referring to the TEM image of FIG. 5 below, it was confirmed that the thickness uniformity of the top and bottom of the TiN thin film deposited in Example 1 (SP—TiCl$_4$) was superior to that of the TiN thin film deposited in Comparative Example 1 (TiCl$_4$) in step conformability. Here, the cross sections of the top and the bottom may be explained by FIG. 6 below. The cross section of the top is formed at 200 nm below the top, and the cross section of the bottom is formed at 100 nm above the bottom.

Reference Example 1

The same procedure as in Example 1 was performed to form a TiN thin film as a self-limiting atomic layer, except that tert-butyl chloride was used as a growth inhibitor for forming a thin film instead of tert-butyl bromide. SIMS analysis was performed to compare the impurity reduction characteristics, i.e., the process by-product reduction characteristics of the TiN thin film deposited according to Example 1, and the results are shown in Table 6 below.

TABLE 6

| Classification | | Example 1 | Reference Example 1 |
|---|---|---|---|
| Cl reduction rate (Cl intensity (c/s)) | 460° C. | 48.2% (8043) | 32.4% (9014) |
| | 500° C. | 68.9% (2728) | 24.3% (5412) |
| | 550° C. | 49.7% (1591) | 21.7% (2620) |

Reference thickness: 10 nm. As shown in Table 6, it was confirmed that Example 1 using the bromide growth inhibitor for forming a thin film according to the present invention had a higher Cl reduction rate than Reference Example 1 using the chloride growth inhibitor for forming a thin film, and thus the impurity reduction characteristics of Example 1 were superior to those of Reference Example 1.

5) Thin Film Crystallinity

FIG. 8 below is an XRD analysis graph for a case (Ref TiN) in which no growth inhibitor for forming a thin film was added according to Comparative Example 1, a case (tert-BuI (0.1 g/min)) in which a growth inhibitor for forming a thin film was added in an amount of 0.1 g/min according to Example 4, and a case (tert-BuI (0.01 g/min)) in which a growth inhibitor for forming a thin film was added in an amount of 0.01 g/min according to Example 4. As in Example 4, when the precursor compound for forming a thin film was adsorbed first, argon purging was performed, and then the growth inhibitor (tert-BuI) for forming a thin film was adsorbed, the crystal grains of the thin film became larger. That is, crystallinity increased. Here, the size of the crystal grains may be identified as the peak 200 at the position of the TiN thin film, and crystallinity increases as the peak at the position becomes larger and sharper. When the crystallinity is increased in this way, resistivity may be greatly improved.

6) Thin Film Density

When density was measured according to X-ray reflectivity (XRR) analysis for a case (Ref TiN) in which no growth inhibitor for forming a thin film was added according to Comparative Example 1, a case (tert-BuI (0.1 g/min)) in which a growth inhibitor for forming a thin film was added in an amount of 0.1/min according to Example 4, and a case (tert-BuI (0.01 g/min)) in which a growth inhibitor for forming a thin film was added in an amount of 0.01 g/min according to Example 4, the TiN thin film formed in Comparative Example 1 had a density of 4.85 g/cm$^3$, the TiN thin film formed using 0.01 g/min of tert-BuI in Example 4 had a density of 5.00 g/cm$^3$, and the TiN thin film formed using 0.1 g/min of tert-BuI in Example 4 had a density of 5.23 g/cm³. As in Example 4, when the precursor compound for forming a thin film was adsorbed first, argon purging was performed, and then the growth inhibitor (tert-BuI) for forming a thin film was adsorbed, thin film density was greatly increased. Accordingly, the thin film according to the present invention may improve the bending characteristics of an integrated structure having a high aspect ratio, such as DRAM capacitance, and may have excellent barrier metal characteristics.

Accordingly, the present invention may provide a thin film having a density of 4.95 g/cm³ or more, preferably 5.00 g/cm³ or more, as a specific example, 4.95 to 5.50 g/cm³, as a preferred example, 5.0 to 5.3 g/cm³.

The invention claimed is:

1. A method of forming a thin film, consisting of injecting a thin film-forming growth inhibitor into an ALD chamber and adsorbing the thin film-forming growth inhibitor and a precursor compound on a surface of a loaded substrate;
   vaporizing a precursor compound for forming a thin film and adsorbing the precursor compound on the surface of the substrate loaded into the ALD chamber; and
   supplying a reaction gas into the ALD chamber:
   wherein the thin film-forming growth inhibitor is selected from the group consisting of tert-butyl bromide, 1-methyl-1-bromocyclohexane, tert-butyl iodide, and tert-butyl chloride and is in a liquid state at room temperature (22° C.) and has a density of 0.8 to 1.5 g/cm³, a vapor pressure (20° C.) of 1 to 300 mmHg, and a solubility (25° C.) of 200 mg/L or less in water,
   wherein the growth inhibitor for forming a thin film and the precursor compound for forming a thin film are transferred into the ALD chamber by a VFC method, a DLI method, or an LDS method,
   wherein a ratio of an amount (mg/cycle) of the growth inhibitor for forming a thin film to an amount (mg/cycle) of the precursor compound for forming a thin film fed into the ALD chamber is 1:1.5 to 1:20, and
   wherein the reaction gas is a reducing agent, a nitrifying agent, or an oxidizing agent.

2. The method according to claim 1, consisting of:
   i) vaporizing the growth inhibitor for forming a thin film and adsorbing the growth inhibitor on a surface of a substrate loaded into an ALD chamber;
   ii) performing first purging of an inside of the ALD chamber using a purge gas;
   iii) vaporizing a precursor compound for forming a thin film and adsorbing the precursor compound on the surface of the substrate loaded into the ALD chamber;
   iv) performing second purging of the inside of the ALD chamber using a purge gas; and
   vi) performing third purging of the inside of the ALD chamber using a purge gas.

3. The method according to claim 1, consisting of:
   ii) performing first purging of an inside of the ALD chamber using a purge gas;
   iii) vaporizing the growth inhibitor for forming a thin film and adsorbing the growth inhibitor on the surface of the substrate loaded into the ALD chamber;
   iv) performing second purging of the inside of the ALD chamber using a purge gas; and
   vi) performing third purging of the inside of the ALD chamber using a purge gas.

4. The method according to claim 1, wherein, in the method of forming a thin film, a rate of decrease in thin film growth rate per cycle (Å/cycle) calculated by Equation 1 below is −5% or less:

Rate of decrease in thin film growth rate per cycle (%)=[(Thin film growth rate per cycle when a growth inhibitor for forming a thin film is used−Thin film growth rate per cycle when a growth inhibitor for forming a thin film is not used)/Thin film growth rate per cycle when a growth inhibitor for forming a thin film is not used]×100.　　[Equation 1]

5. The method according to claim 1, wherein, in the method of forming a thin film, an intensity (c/s) of halogen remaining in a thin film formed after 200 cycles measured according to SIMS is 10,000 or less.

6. A semiconductor substrate fabricated by the method of forming a thin film according to claim 1.

* * * * *